(12) United States Patent
Takeuchi et al.

(10) Patent No.: US 6,903,391 B2
(45) Date of Patent: Jun. 7, 2005

(54) SOLID STATE IMAGE PICKUP DEVICE

(75) Inventors: Yutaka Takeuchi, Miyagi (JP);
Masako Sato, Miyagi (JP); Mariko Nakamura, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/851,416

(22) Filed: May 24, 2004

(65) Prior Publication Data

US 2005/0051860 A1 Mar. 10, 2005

(30) Foreign Application Priority Data

Sep. 10, 2003 (JP) .................................... 2003-318355
Sep. 10, 2003 (JP) .................................... 2003-318356

(51) Int. Cl.[7] ..................... H01L 27/148; H01L 29/768
(52) U.S. Cl. ........................................ 257/233; 257/222
(58) Field of Search ................................ 257/222–233

(56) References Cited

U.S. PATENT DOCUMENTS

| | | | |
|---|---|---|---|
| 4,667,092 A | 5/1987 | Ishihara | |
| 6,388,278 B1 * | 5/2002 | Suzuki et al. | 257/222 |
| 6,528,831 B2 * | 3/2003 | Umetsu et al. | 257/233 |
| 6,806,904 B1 * | 10/2004 | Kim | 257/232 |
| 2003/0141564 A1 | 7/2003 | Kondo et al. | |

FOREIGN PATENT DOCUMENTS

| | | |
|---|---|---|
| JP | 4-55028 | 9/1992 |
| JP | 09-205589 | 8/1997 |
| JP | 11-040787 | 2/1999 |
| JP | 2003-218343 | 7/2003 |

* cited by examiner

*Primary Examiner*—Cuong Nguyen
(74) *Attorney, Agent, or Firm*—Arent Fox PLLC

(57) ABSTRACT

A solid state image pickup device includes: a semiconductor substrate defining light receiving areas; pixels formed in the light receiving areas, each pixel including a high and a low sensitivity photoelectric conversion element; a light shielding film formed above the light receiving areas and having an opening above each pixel, the opening exposing at least a partial area of the high and the low sensitivity photoelectric conversion element; an on-chip micro lens formed above each opening, the on-chip micro lens converging incidence light; and an inner lens formed between the light shielding film and the on-chip micro lens and above the opening, the inner lens being disposed so that the inner lens receives light converged by the on-chip micro lens, excluding a portion of the light, and further converges the received light to make the portion of the light propagate toward the opening without passing through the inner lens.

24 Claims, 13 Drawing Sheets

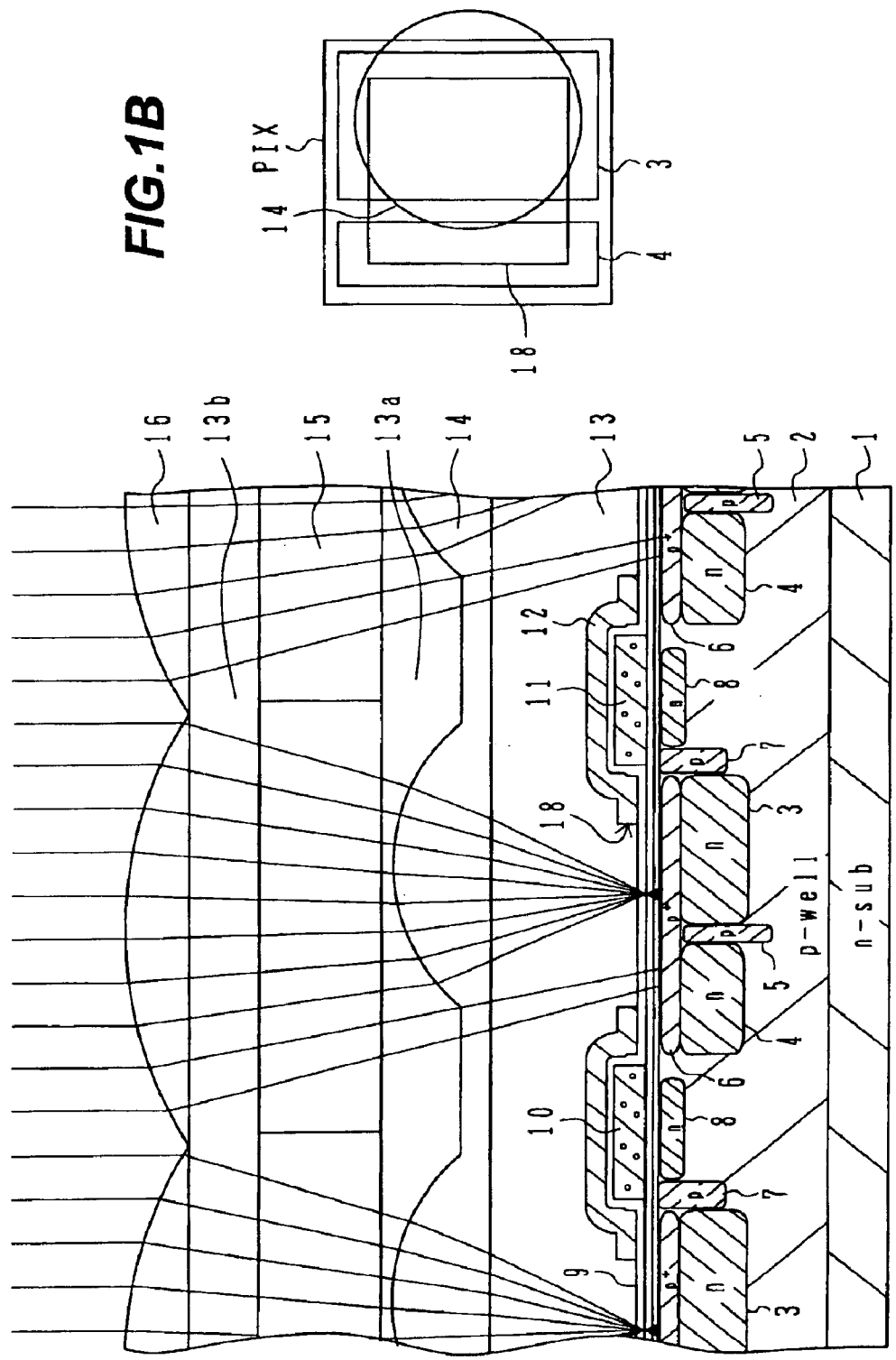

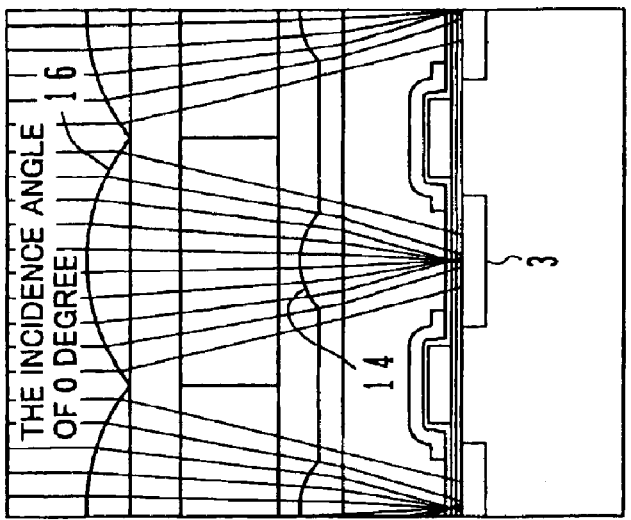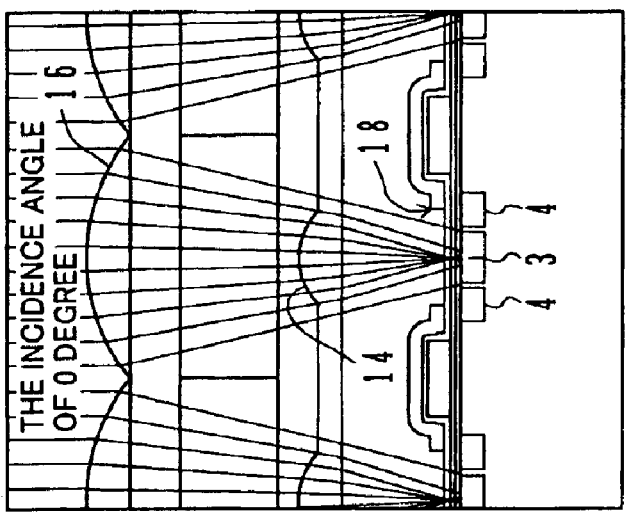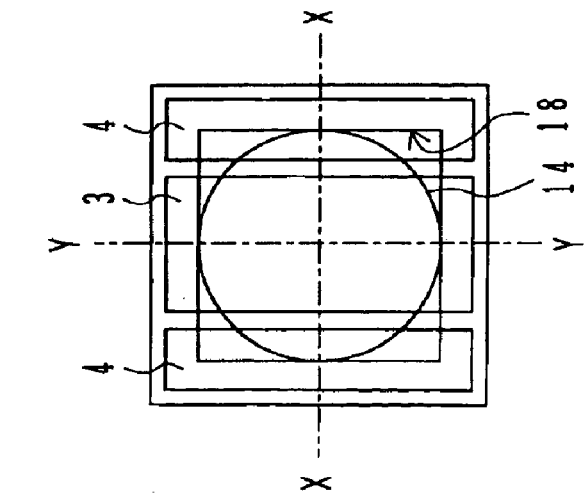

TRANSFERRED DIRECTION

TRANSFERRED DIRECTION

SOLID STATE IMAGE PICKUP DEVICE

CROSS REFERENCE TO RELATED APPLICATION

This application is based on and claims priority of Japanese Patent Applications No. 2003-318355 and No. 2003-318356 both filed on Sep. 10, 2003, the entire contents of which are incorporated herein by reference.

BACKGROUND OF THE INVENTION

A) Field of the Invention

The present invention relates to a solid state image pickup device, and more particularly to a solid state image pickup device having a wide dynamic range.

B) Description of the Related Art

Solid state image pickup devices are widely used which has a number of photodiode pixels on a semiconductor substrate. As the number of pixels is increased by high integration, the resolution becomes high. Some solid image pickup devices surpass the resolution of silver salt cameras. If a chip area is suppressed from being broadened and the number of pixels is increased, the area occupied by one pixel can be reduced. In order to avoid a low S/N ratio and obtain a high sensitivity, it is desired to efficiently use incidence light.

A light reception area of the semiconductor substrate is required to form not only photodiodes but also charge transfer CCDs for a CCD type, and an image signal forming circuit and an image signal transfer unit for a MOS type. Light incident upon an area excepting the photodiode area is unavailable. In order to efficiently use incidence light, on-chip micro lenses have been formed above pixels.

FIG. 11A is a cross sectional view showing the structure of a CCD solid state image pickup device having on-chip micro lenses proposed in Japanese Patent Publication No. HEI-4-55028. Photodiodes PDs and VCCD channels VCs are formed in regions in a surface layer of a semiconductor substrate SUB, the regions having an opposite conductivity to that of the substrate. Electric charges can be read from the photodiode PD to the channel VC via a transfer gate region TG formed therebetween. Transfer electrodes TE are formed on an insulating layer above the transfer gate region TG and channel VC, and a light shielding layer LS is formed above the transfer electrodes TE. The light shielding layer LS intercepts light incident upon a nearby area of the channel VC to reduce noises.

On-chip micro lenses MLs are formed on a planarizing layer PL formed above the substrate. Each on-chip micro lens has its optical axis aligned with the center of a corresponding photodiode. The micro lenses are formed contacting each other to converge most of incidence light upon photodiodes. By using the on-chip micro lenses, incident light can be used efficiently irrespective of that the light shielding layer exists.

A photodiode accumulates signal charges by an amount corresponding to the incidence light amount. As the charges in the photodiode saturate, the charges generated thereafter by photoelectric conversion of incidence light cannot be accumulated. If the opening through which light becomes incident upon a photodiode is made narrow, although the dynamic range can be increased because of the reduced amount of charges generated by a unit light amount, the sensitivity lowers. If the sensitivity is to be retained, the dynamic range of a solid state image pickup device having photodiode pixels becomes narrower than that of a silver salt film.

A combination of a high sensitivity photoelectric conversion element and a low sensitivity photoelectric conversion element formed in one pixel area has been proposed in order to broaden the dynamic range.

FIG. 11B is a plan view showing the structure of a solid state image pickup device having a pixel division structure proposed in Japanese Patent Laid-open Publication No. HEI-9-205589. In one pixel area, two photodiodes PD1 and PD2 are formed separated by a channel stop region CS. A light shielding film is formed above the photodiodes. The light shielding film has a broad opening LA above the photodiode PD1 and a narrow opening SA above the photodiode PD2. The broad opening LA forms a high sensitivity photoelectric conversion element HS-PEC, and the narrow opening SA forms a low sensitivity photoelectric conversion element LS-PEC. An on-chip micro lens ML is disposed above the broad opening LA to further improve the sensitivity.

Light not incident upon the on-chip micro lens ML and the narrow opening SA is not used. If an on-chip micro lens covering most of the pixel area such as shown in FIG. 11A is used, although most of incidence light can be used, the incidence light cannot be distributed to the two openings LA and SA because the micro lens has only one focal point.

The present applicant submitted the application proposing the structure that two photodiodes, a main and a subsidiary photodiode formed in each pixel area, are exposed in a common opening (refer to Japanese Patent Laid-open Publication No. 2003-218343).

FIGS. 12A, 12B and 12C are a plan view and cross sectional views showing in part the proposed structure.

FIG. 12A is a plan view of a solid state image pickup device, and FIGS. 12B and 12C are cross sectional views taken along lines XB—XB and XC—XC shown in FIG. 12A. In FIG. 12A, two pixels PIXs are shown disposed side by side. Each pixel PIX includes a main photodiode region 3 and a subsidiary photodiode region 4. A vertical charge transfer channel (VCCD) 8 is disposed to the right of the pixel PIX.

In the honeycomb pixel layout shown, pixels on the upper and lower sides of the two pixels shown are disposed at positions shifted by a half pitch in the lateral direction. Polysilicon electrode 24, 25, 28 and 29 (collectively indicated by EL) for four-phase drive are disposed above VCCD 8. For example, the transfer electrodes 24 and 28 are made of a first polysilicon layer and the transfer electrodes 25 and 29 are made of a second polysilicon layer. The transfer electrode 25 also controls reading charges from the subsidiary photodiode 4, and the transfer electrode 28 also controls reading charges from the main photodiode 3.

As shown in the cross sectional views of FIGS. 12B and 12C, a p-type well 2 is formed in the surface layer of an n-type semiconductor substrate 1. Two n-type regions 3 and 4 are formed in the surface layer of the p-type well 2 to constitute the two main and subsidiary photodiodes. A $p^+$-type region 7 is a channel stopper for electrical separation of pixels, VCCDs and the like. As shown in FIG. 12C, an n-type channel region 8 constituting VCCD is formed near the n-type region 3 (4) constituting the photodiode. The n-type region 3 (4), p-type well 2 and n-type substrate 1 constitute a shutter structure.

An insulating layer of silicon oxide or the like is formed on the surface of the semiconductor substrate, and the transfer electrodes EL of polysilicon are formed on the insulating layer. The transfer electrodes EL are disposed covering the area above the VCCD channel 8. An insulating layer of silicon oxide or the like is formed covering the transfer electrodes EL. A light shielding film 12 of tungsten or the like is formed on the insulating layer. The light shielding film 12 covers the constituent elements of pixels such as VCCDs and has openings above the photodiodes. An interlayer insulating film 13 of phosphosilicate glass or the like is formed covering the light shielding film 12, the interlayer insulating film 13 having a planarized surface.

A color filter 15 is formed on the interlayer insulating film 13. On-chip micro lenses 16 of resist or the like are formed on the color filter 15 at positions corresponding to the pixels. One on-chip micro lens 16 is formed above each pixel, and an opening 18 of the light shielding film 12 is disposed under the on-chip micro lens 16. The on-chip micro lens 16 has a function of converging downward incident light toward the opening 18.

It is desired to improve the light convergence efficiency because of recent device miniaturization and high integration. It is said that the convergence effect of the on-chip micro lens is now almost at its limit, and various proposals have been made to inserting an in-layer (inner) lens under the on-chip micro lens (for example, refer to Japanese Patent Laid-open Publication No. HEI-11-40787).

SUMMARY OF THE INVENTION

An object of this invention is to provide a solid state image pickup device having a broad dynamic range while good device characteristics are retained.

Another object of this invention is to provide a solid state image pickup device having a high incidence light use efficiency and a broad dynamic range.

Still another object of this invention is to provide a solid state image pickup device having a novel structure.

According to one aspect of the present invention, there is provided a solid state image pickup device including: a semiconductor substrate defining light receiving areas; a number of pixels formed in the light receiving areas of the semiconductor substrate, each pixel including a high sensitivity photoelectric conversion element and a low sensitivity photoelectric conversion element; a light shielding film formed above the light receiving areas and having an opening above each pixel, the opening exposing at least a partial area of the high sensitivity photoelectric conversion element and at least a partial area of the low sensitivity photoelectric conversion element; an on-chip micro lens formed above each opening of the light shielding film, the on-chip micro lens converging incidence light; and an inner lens formed between the light shielding film and the on-chip micro lens and above the opening, the inner lens being disposed so that the inner lens receives light converged by the on-chip micro lens, excluding a portion of the light, and further converges the received light to make the portion of the light propagate toward the opening without passing through the inner lens.

A use efficiency of incidence light is maintained high by using the on-chip micro lens. The characteristics of the high sensitivity photoelectric conversion element are maintained good and the use efficiency of incidence light is maintained high, by using the inner lens. One opening per pixel is formed, and a portion of light converged by the on-chip micro lens is made incident upon the low sensitivity photoelectric conversion element without passing it through the inner lens to thereby improve also the characteristics of the low sensitivity photoelectric conversion element.

BRIEF DESCRIPTION OF THE DRAWINGS

FIGS. 1A to 1C are a cross sectional view and plan views showing the outline structure of a solid state image pickup device according to an embodiment of the invention.

FIGS. 7A to 7C are a schematic plan view showing a solid state image pickup device according to a second embodiment and cross sectional views illustrating the function of the solid image pickup device.

DESCRIPTION OF THE PREFERRED EMBODIMENTS

Figure 1C:
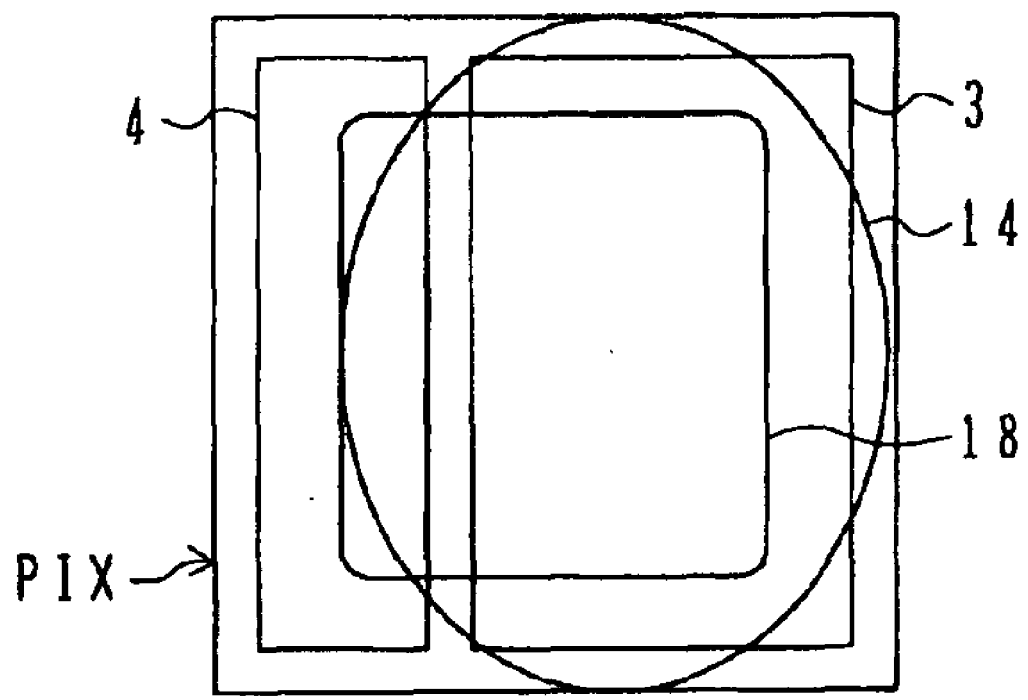

Embodiments of the invention will be described with reference to the accompanying drawings.

FIG. 1A is a schematic cross sectional view showing the structure of a solid state image pickup device according to a first embodiment of the invention. A p-type well 2 is formed in the surface layer of an n-type substrate 1. In the surface layer of the p-type well 2, n-type regions 3 and 4 are formed. The p-type well 2 and n-type regions 3 and 4 constitute first and second photodiodes. A p-type element isolation region 5 is formed between the two n-type regions 3 and 4. Additionally formed in the surface layer of the p-type well 2 are VCCD n-channel regions 8, p-type element isolation regions 7, $p^+$-type buried regions 6 and the like.

Polysilicon transfer electrodes 10 and 11 are formed on an insulating layer 9 made of an oxide-nitride-oxide (ONO) film or the like formed on the semiconductor substrate surface. A light shielding film 12 of tungsten or the like is formed on an insulating layer covering the transfer electrodes 10 and 11. The light shielding film 12 has an opening 18 in an area corresponding to the central area of each pixel including a main photodiode 3 and a subsidiary photodiode 4. A partial area of the main photodiode 3 and a partial area of the subsidiary photodiode 4 are exposed in the opening to receive incidence light. An aperture ratio of the main photodiode 3 is set larger than that of the subsidiary photodiode 4. Therefore, the subsidiary photodiode has a lower sensitivity than that of the main photodiode, and the subsidiary photodiode is hard to be saturated.

An insulating layer 13 made of a phosphorus glass layer or the like is formed on the light shielding film, the insulating layer having a planarized surface. Inner lenses 14 are formed on the planarized surface of the insulating layer 13. The optical axis of the inner lens 14 is shifted to the right of the center of the opening 18 of the light shielding film, i.e., toward the direction departing from the subsidiary photodiode area 4. The inner lens 14 is formed by depositing a silicon nitride film having a reflectivity of, for example, 1.8 to 2.4, forming a resist pattern on the silicon nitride film, softening and melting the resist pattern to form lens shapes, and thereafter transferring the lens shapes of the resist pattern to the silicon nitride film through anisotropical etching.

After the inner lens 14 is formed, a planarizing film 13a is formed burying the irregular surface of the inner lenses 14. The planarizing film 13a has a planarized surface and is made of an organic resin film, a phosphorus glass film, a boron-phosphorus glass film or the like. A color filter 15 is formed on the planarized surface. The color filter 15 includes color filters of three or more colors. A planarizing film 13b of an organic resin film or the like is formed burying the irregular surface of the color filter 15 and forming a planarized surface.

On-chip micro lenses 16 are formed on the planarized surface of the planarizing film 13b. For example, the on-chip micro lens 16 is formed by pattering a photoresist layer, softening and melting the patterned photoresist layer to form spherical surfaces, and thereafter curing the photoresist. The optical axis of the on-chip micro lens 16 is aligned approximately to the center of the opening 18 of the light shielding film 12. A light flux converged by the on-chip micro lens 16 propagates toward the opening 18.

FIG. 1B is a schematic plan view showing the relation among the pixel PIX including the main photodiode 3 and subsidiary photodiode 4, the opening 18 of the light shielding film and the upper inner lens 14. As shown, the pixel PIX has a square quadrilateral shape. The rectangular main photodiode 3 and rectangular subsidiary photodiode 4 are juxtaposed occupying most of the area of the pixel PIX. The opening 18 is disposed in the central area of the pixel PIX. The main photodiode area 3 extends from the right end of the pixel to the left of the center of the opening 18. The center of the main photodiode is therefore at the right position of the center of the opening.

The subsidiary photodiode area 4 extends from near the left end of the pixel, via the left end of the opening 18, partially into the opening area 18. The aperture ratio of the subsidiary photodiode 4, the ratio of the subsidiary photodiode area 4 to the area exposed to the opening 18, is set smaller than that of the main photodiode 3.

The larger the aperture ratio of a photodiode, the larger the amount of incidence light is, and hence the higher the sensitivity is. Assuming that the charge accumulation capability per unit area is constant, the saturation light amount can be set higher the lower the aperture ratio is. An effective aperture ratio can be changed by converging incidence light with the on-chip micro lens and inner lens.

The inner lens 14 is shifted to the right of the center of the opening 18 in such a manner that the focal point thereof is positioned in the main photodiode area 3. For example, if the left side of the main photodiode area 3 is spaced from the left side of the opening 18 by a distance d, the inner lens 14 is shifted by d/4 or more, e.g., d/2 or more and d or less from the center of the opening in the same direction.

As shown in FIG. 1A, the on-chip micro lens 16 converges incidence light as much as possible toward the opening 18. Since the inner lens 14 is shifted toward the main photodiode area 3, a space is left on the side of the subsidiary photodiode 4. Therefore, the inner lens 14 receives most of the light converged by the on-chip micro lens 16, and further converges it to preferably focus it on the surface of the n-type region 3 of the semiconductor substrate. The effective aperture ratio can be increased further.

Light converged by the on-chip micro lens 16 but not transmitted through the inner lens 14 passes through the opening 18 and becomes incident upon the surface of the subsidiary photodiode area 4. All of the light not passed through the inner lens 14 may not be incident upon the subsidiary photodiode area 4, but a portion thereof may be incident upon the main photodiode area 3 or upon the separation region 5 between the main and subsidiary photodiode. Since the light converged by the inner lens 14 becomes incident upon the main photodiode area 3, the main photodiode is set to a higher sensitivity and the subsidiary photodiode is set to a lower sensitivity (i.e., to a higher saturation light amount), than those corresponding to the actual aperture ratios.

As shown in FIG. 1C, the plan shape of the inner lens 14 may be an elliptic shape having a short axis and a long axis in plane. In this case, FIG. 1A is a cross sectional view taken along the short axis direction of the elliptic inner lens 14. As shown in FIG. 1C, since the elliptic inner lens 14 occupies a larger area of the main photodiode area 3, a space is left on the subsidiary photodiode 4 side. Therefore, the elliptic inner lens 14 receives most of the light converged by the on-chip micro lens 16, and further converges it to preferably focus it on the surface of the n-type region 3 of the semiconductor substrate along the short axis direction. Along the long axis direction, the light is focused on a line along the extension direction of the main photodiode 3. The effective aperture ratio can be increased further by the divergence effect of the elliptic inner lens.

Figure 2:
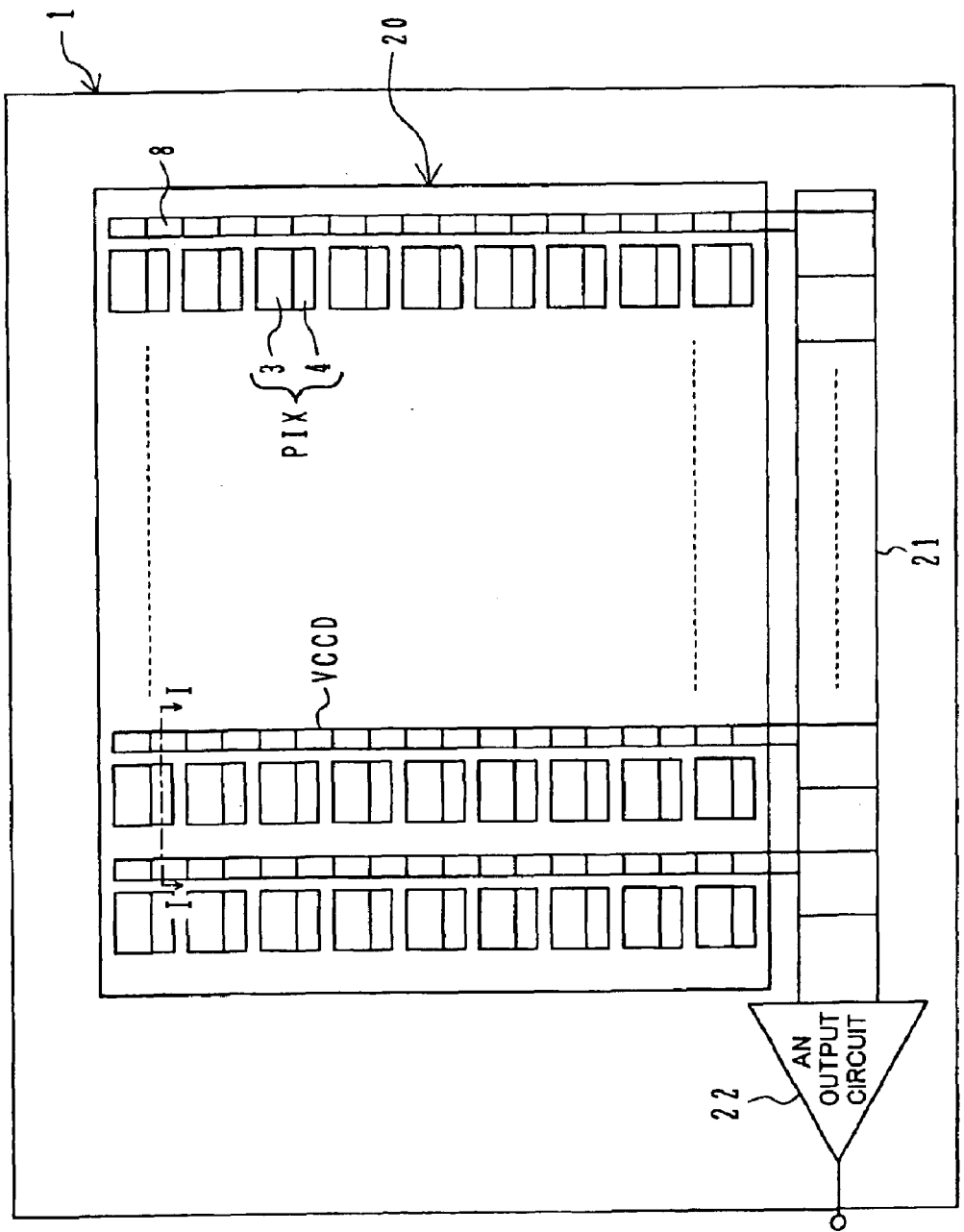
FIG. 2 is a plan view showing the overall structure of a solid state image pickup device.

FIG. 2 is a schematic plan view showing the overall structure of the semiconductor substrate of the solid state image pickup device having the pixel structure shown in FIGS. 1A and 1B. A light reception area 20 is defined on the surface of the semiconductor chip 1, and a plurality of pixels PIXs are disposed in a matrix shape. Each pixel PIX includes a main photodiode 3 and a subsidiary photodiode 4. VCCD is disposed along each column of pixels PIXs. One HCCD 21 is disposed under a plurality of VCCDs. HCCD 21 transfers image signals of one row. An output circuit 22 is connected to an output end of HCCD 21.

The layout of pixels is not limited to a square matrix.

Figure 3:
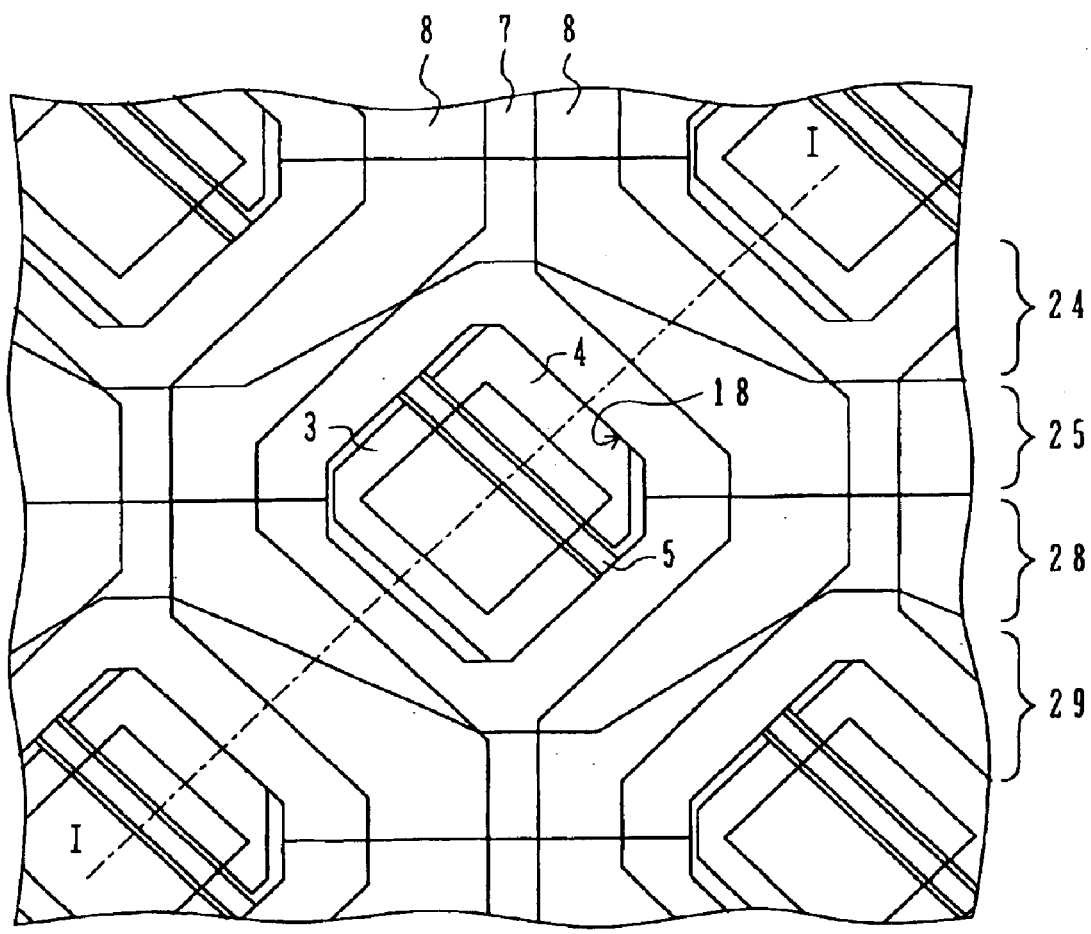
FIG. 3 is a partial plan view showing the layout of a solid state image pickup device.

FIG. 3 shows an example of a honeycomb layout or pixel shift layout. Respective pixels each including the main and subsidiary photodiodes 3 and 4 are disposed shifted by a half pitch every row along the row direction. Therefore, respective pixels are also disposed shifted by a half pitch every column.

Four-phase drive electrodes 24, 25, 28 and 29 are disposed along the row direction. A pixel is disposed in a space defined by these drive electrodes. A light shielding film above the transfer electrodes has an opening 18 in an area corresponding to the central area of each pixel. A partial area of the main photodiode area 3 and a partial area of the subsidiary photodiode area 4 are exposed in each opening 18. The aperture ratio of the main photodiode area 3 is set larger than that of the subsidiary photodiode area 4. Therefore, when light at the same intensity becomes incident, the main photodiode area 3 saturates first and then the subsidiary photodiode area 4 saturates.

As shown in FIG. 1B, since the inner lens 14 converges incidence light on the main photodiode area 3, the sensitivity of the main photodiode is raised further so that the saturation light amount of the subsidiary photodiode becomes considerably larger than that of the main photodiode area 3. In order not to lower the performance greatly as compared to that of one photodiode per pixel, it is desired to make the main photodiode 3 have an area as broad as possible to receive most of incidence light and provide a high sensitivity.

The subsidiary photodiode area 4 is used so as to broaden the dynamic range at a high illuminance, and is used mainly for obtaining image information after the main photodiode area 3 is saturated. The subsidiary photodiode may have a lower precision than the main photodiode. The substrate surface area occupied by the subsidiary photodiode area 4 is set narrower than that of the main photodiode area so as not to lower the performance of the main photodiode.

Figure 4A:
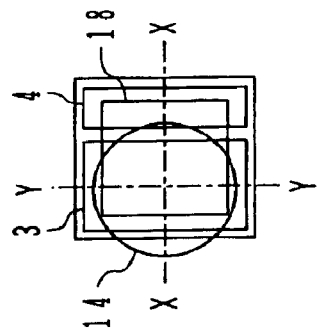
FIGS. 4A to 4E are cross sectional views and a plan view illustrating the function of the solid state image pickup device shown in FIGS. 1A and 1B.

As shown in FIG. 4A, light incident upon the semiconductor chip 1 of the solid state image pickup device has passed through a taking lens 30. Although generally perpendicular incidence light is received in the central area of the chip, the incidence light is slanted in the peripheral area of the chip.

Figure 4B:
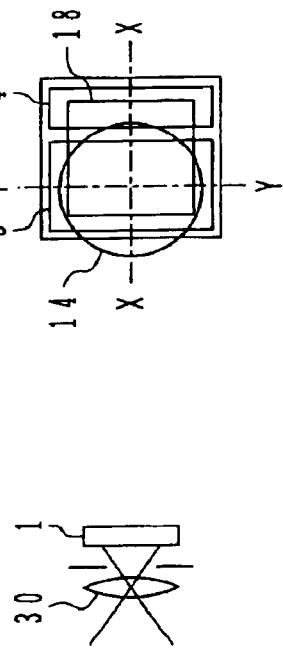
Figure 4C:
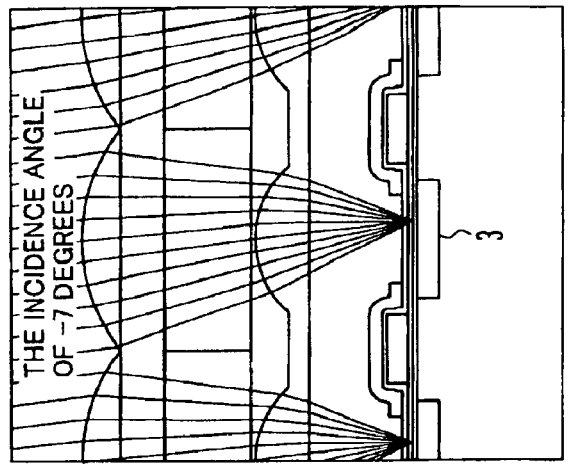

In FIG. 4B, the lateral direction along which the main photodiode area 3 and subsidiary photodiode area 4 are disposed in one pixel is represented by a direction X—X, and the direction perpendicular to the direction X—X is represented by a direction Y—Y. A change in the focussing state with a change in the incidence angle along the Y—Y direction was studied through simulation. FIG. 4C is a cross section along the direction Y—Y when the incidence angle is 0 degree. Incidence light is focussed generally at the center of the main photodiode area 3.

Figure 4D:
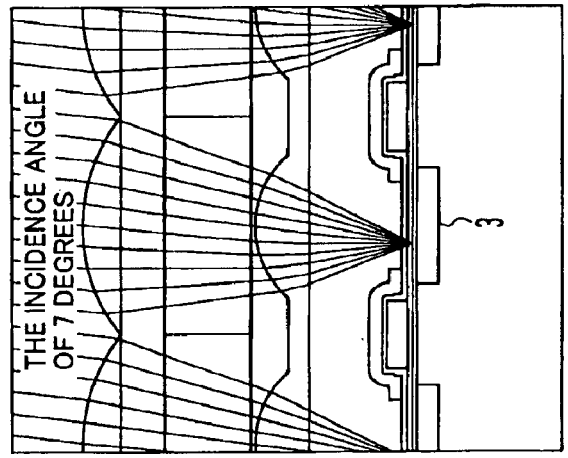

FIG. 4D shows the simulation result at the incidence angle of 7 degrees. As the incidence light is slanted by 7 degrees to the right direction, the focal position moves from the center to the left of the main photodiode area 3.

Figure 4E:
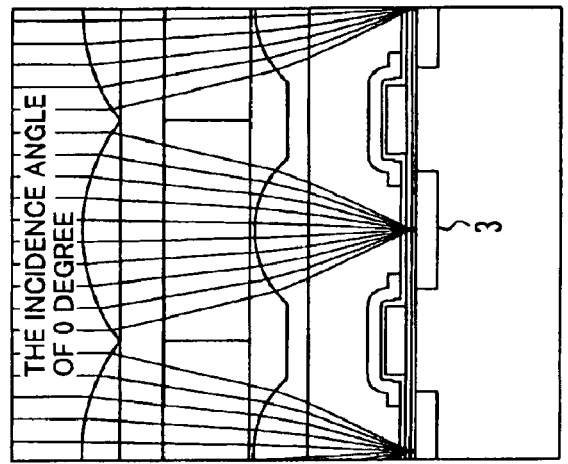

FIG. 4E shows the simulation result at the incidence angle of −7 degrees. Conversely to the case shown in FIG. 4D, the focal position moves from the center to the right of the main photodiode area 3. In either case, light is focussed in the central area of the main photodiode area 3 so that generally the uniform characteristics can be expected.

Figure 5A:
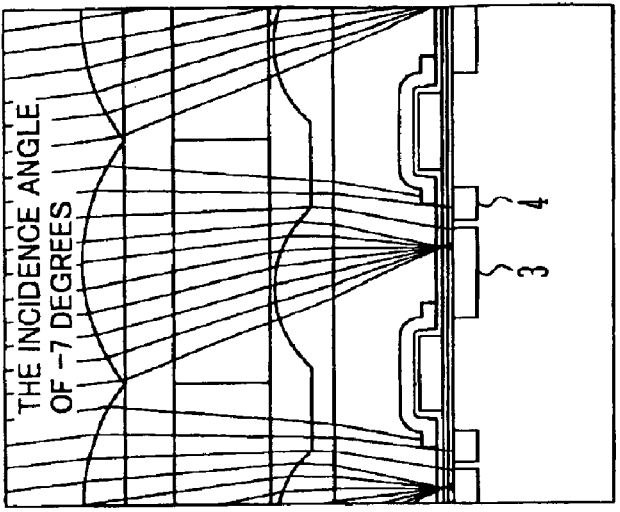
FIGS. 5A to 5D are cross sectional views illustrating the function of the solid state image pickup device shown in FIG. 1A and a schematic plan view illustrating shading prevention.
Figure 5B:
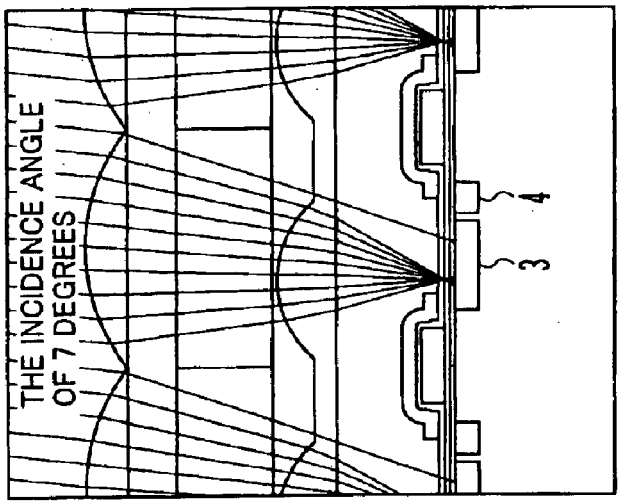
Figure 5C:
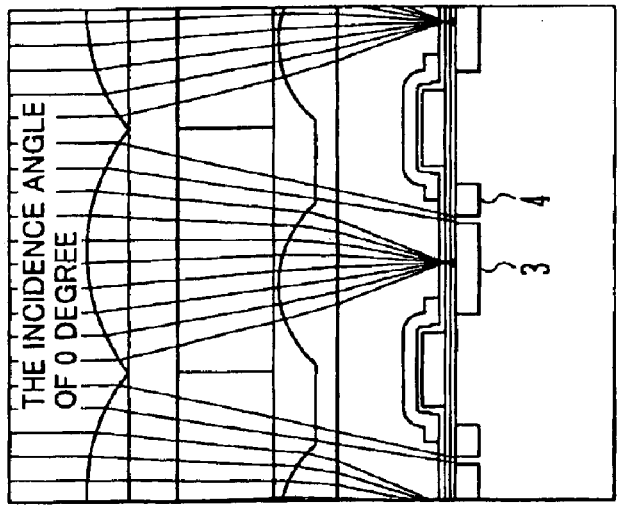

FIGS. 5A, 5B and 5C show the focussing states of light along the X—X direction. In these cross sectional views, the subsidiary photodiode area 4 appears along with the main photodiode area 3. Changes in the focal position in the main photodiode area 3 are similar to those shown in FIGS. 4C, 4D and 4E, and incidence light is focussed in the central area of the main photodiode area 3. In contrast, although there is incidence light at the incidence angles of 0 and −7 degrees, there is no incidence light upon the subsidiary photodiode area 4.

The light incidence angle is constant at each pixel. In order to make light be reliably incident upon the subsidiary photodiode, it is desired to adjust the position of at least the photodiode area at each pixel position.

Figure 5D:
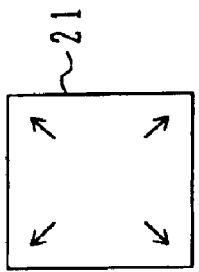

FIG. 5D is a schematic diagram illustrating a method of correcting the relation among the pixel, upper inner lens and upper on-chip micro lens to prevent shading. The positions of the on-chip micro lens, inner lens and pixel are shifted outward along the radial direction, the shift amount being increased in the order from the on-chip micro lens, inner lens and to the pixel and in the order from the light reception center to the outer periphery.

Figure 6A:
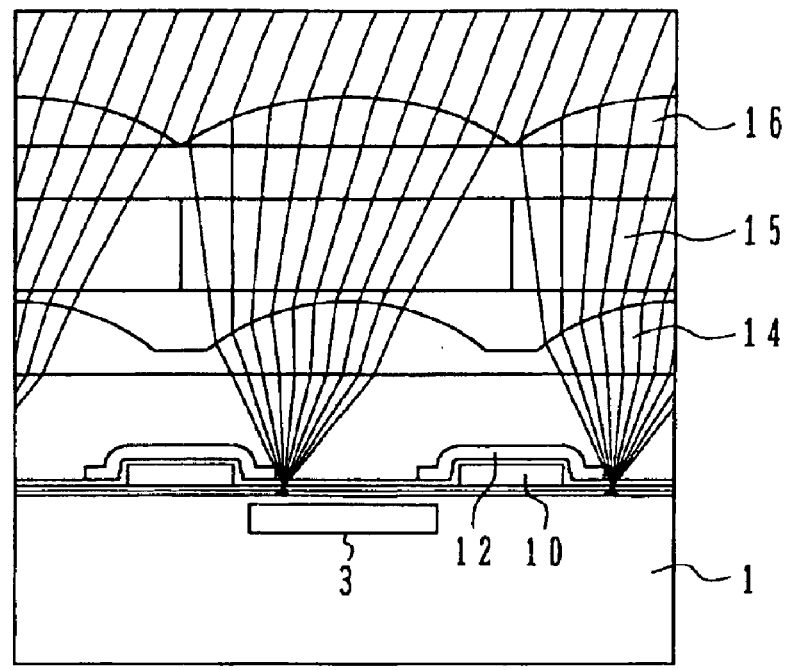
FIGS. 6A and 6B are cross sectional views illustrating the function of the solid state image pickup device shown in FIG. 1C.
Figure 6B:
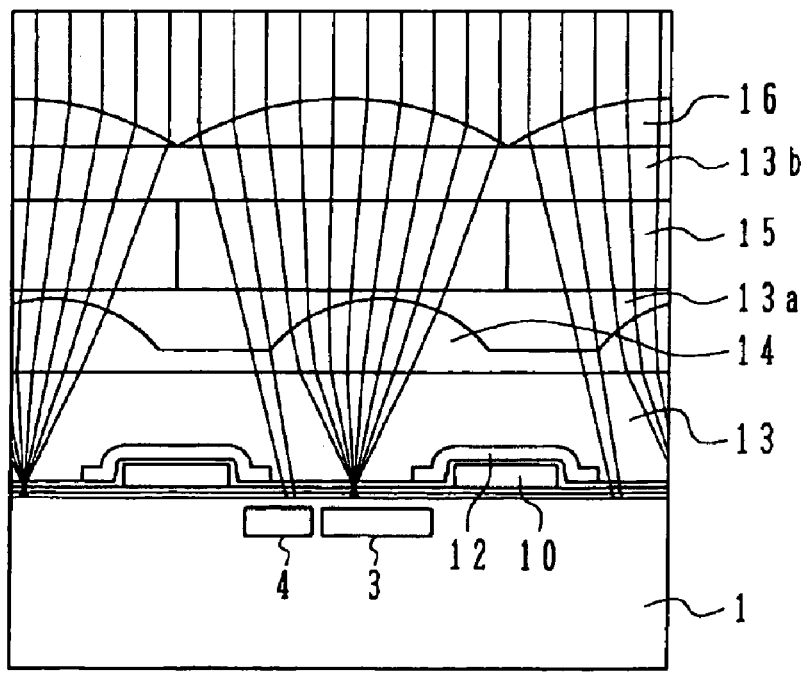

FIGS. 6A and 6B show the simulation results of light focussing states at the cross sections along the long and short axis directions of an elliptic inner lens such as shown in FIG. 1C. An elliptic inner lens has a short focal length in the short axis direction and a long focal length in the long axis direction.

FIG. 6B shows the focussing state on a semiconductor substrate surface in the short axis direction. Since the focussing is made at one point, the position alignment margin for the focussing in the short side direction can be made large in the area of the rectangular main photodiode 3.

As shown in FIG. 6A, light does hot focus at one point but focusses on a line along the long axis direction of the elliptic inner lens 14. Since the longitudinal direction of the line is the direction along the long side of the main photodiode, a sufficient position alignment margin can be obtained.

FIG. 7A is a schematic plan view showing a pixel structure according to a second embodiment of the invention. A main photodiode area 3 is disposed in the central area of each pixel on the semiconductor substrate surface, and subsidiary photodiode areas 4 are disposed on both sides of the central area. It is preferable that the subsidiary photodiode areas are disposed symmetrical to the main photodiode area 3. With this layout, the subsidiary photodiode areas 4 on both sides of the central area operate complementarily.

FIG. 7B shows a light propagation direction in the X—X cross section. Light passed through the inner lens becomes incident upon the main photodiode area 3, and outer light not passed through the inner lens becomes incident upon the subsidiary photodiode area 4.

FIG. 7C shows the focussing state of light along the direction Y—Y. Light passed through the on-chip micro lens 16 and inner lens 14 focusses on the center of the main photodiode area 3. Outer light is focussed on the main photodiode area 3 although it does not pass through the inner lens 14.

Figure 8A:
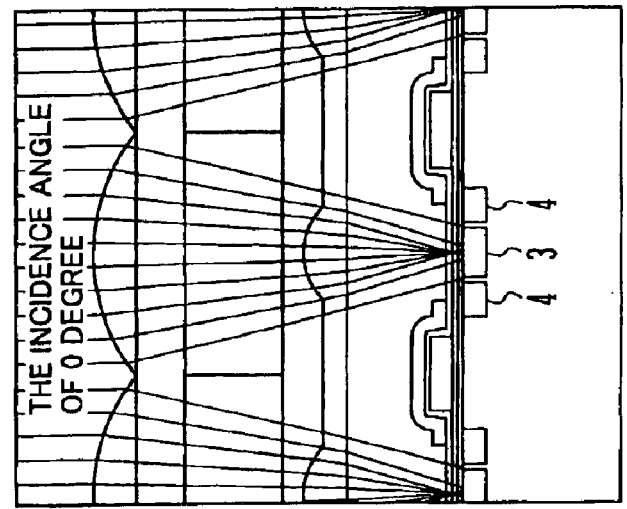
FIGS. 8A to 8C are schematic cross sectional views illustrating the function of the second embodiment.
Figure 8B:
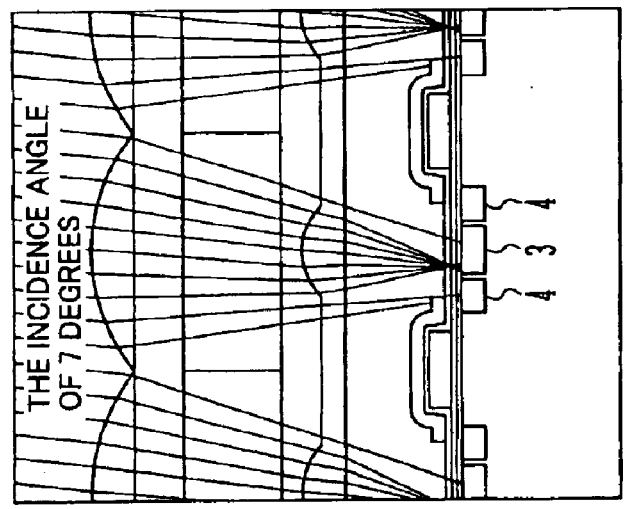
Figure 8C:
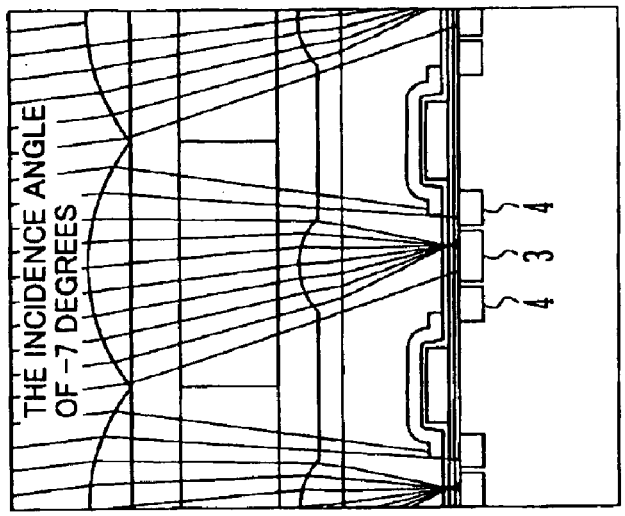

FIGS. 8A, 8B and 8C are cross sectional views showing the simulation results of a focussing state change with an incidence light angle along the direction of disposing the main and subsidiary photodiodes (direction X—X). The simulation results show the focussing state change at different incidence light angles.

FIGS. 8A, 8B and 8C show the focussing states at incidence light angles of 0, 7 and −7 degrees, respectively. As the incidence light angle is slanted, although one of the light fluxes outside the inner lens does not enter one subsidiary photodiode, the other enters the other subsidiary photodiode. It is therefore possible to avoid no incidence light upon the subsidiary photodiode. However, at the slanted incidence light angle, it is not easy to maintain constant an incidence light division ratio between the main and subsidiary photodiodes 3 and 4. The direction of incidence light upon each pixel is determined from the positional relation with the taking lens, and it is constant. Therefore, if two subsidiary photodiodes are used, a position shift for preventing shading may be performed in addition to the position shift for the case of a single subsidiary photodiode.

Figure 9A:
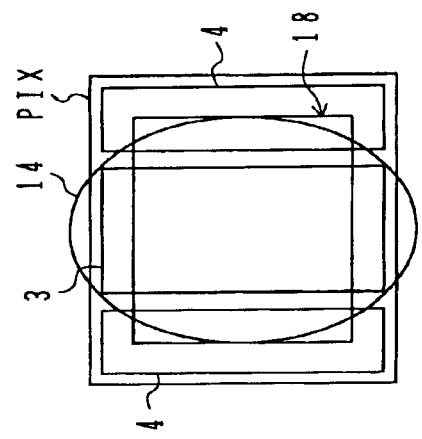
FIGS. 9A to 9D are a schematic plan view showing a solid state image pickup device of the second embodiment and cross sectional views illustrating the function of the solid image pickup device.

FIG. 9A is a schematic plan view showing the pixel structure of the second embodiment using an elliptic inner lens such as shown in FIG. 1C. FIG. 9A corresponds to FIG. 7A. The cross sectional views shown in FIGS. 9B, 9C and 9D correspond to those shown in FIGS. 8A, 8B and 8C.

Figure 9B:
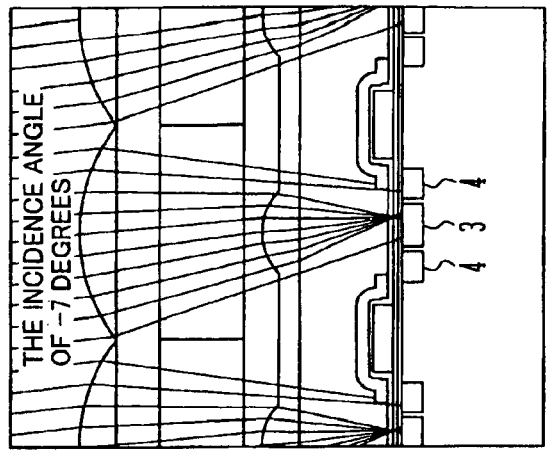
Figure 9C:
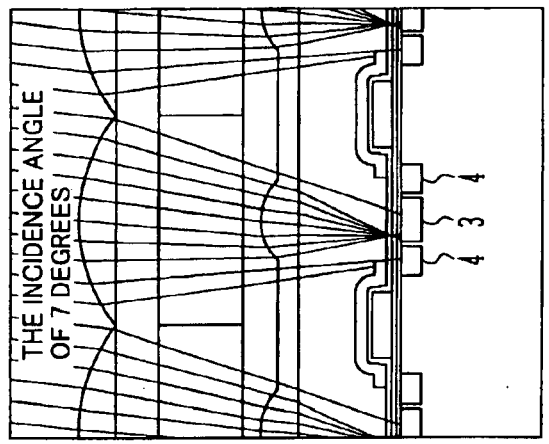
Figure 9D:
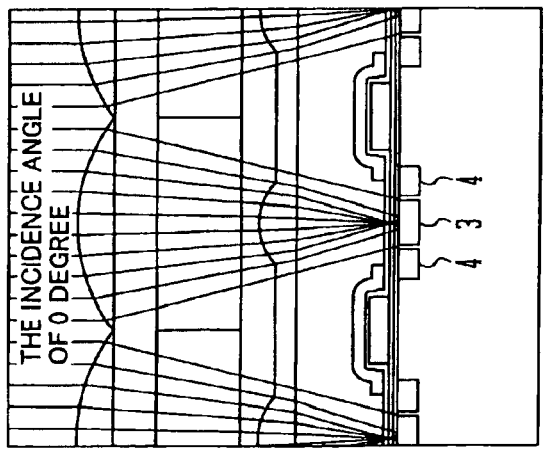

FIGS. 9B, 9C and 9D show the focusing states at incidence light angles of 0, 7 and −7 degrees, respectively. Also in the case of the elliptic inner lens, as the incidence light angle is slanted, although one of the light fluxes outside the elliptic inner lens does not enter one subsidiary photodiode, the other enters the other subsidiary photodiode. It is therefore possible to avoid no incidence light upon the subsidiary photodiode. Shading can be prevented in the manner described earlier.

Figure 10A:
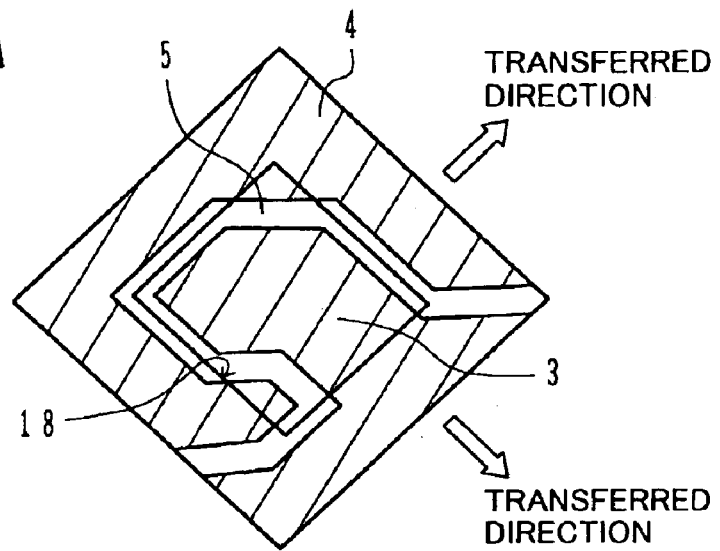
FIGS. 10A and 10B are schematic plan views showing modifications of the first and second embodiments.
Figure 10B:
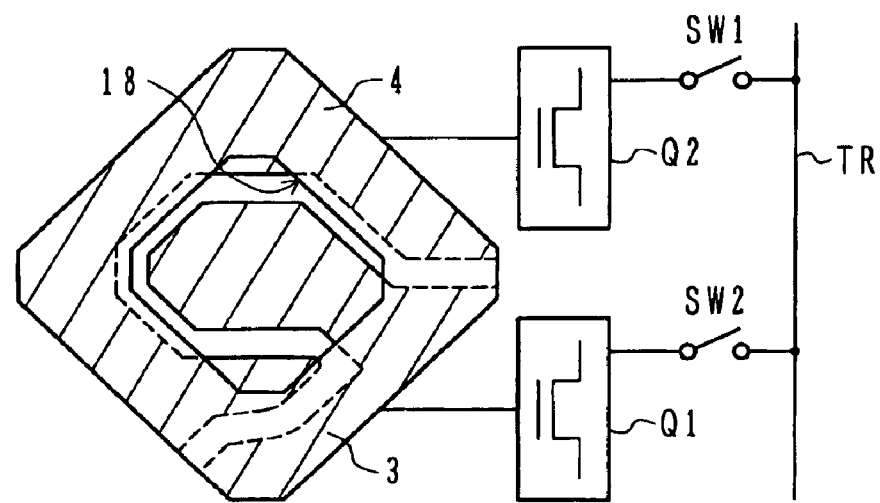
Figure 11A:
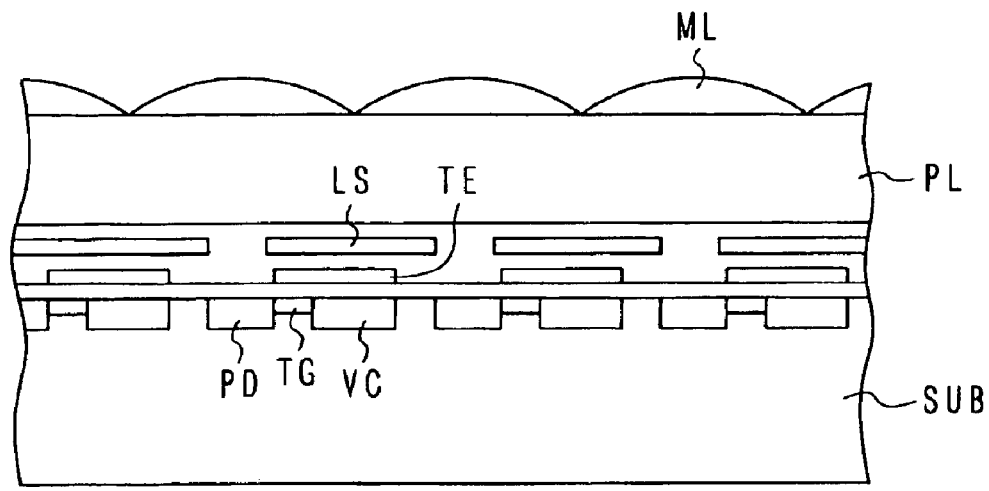
FIGS. 11A and 11B are a cross sectional view and a plan view illustrating prior art examples.
Figure 11B:
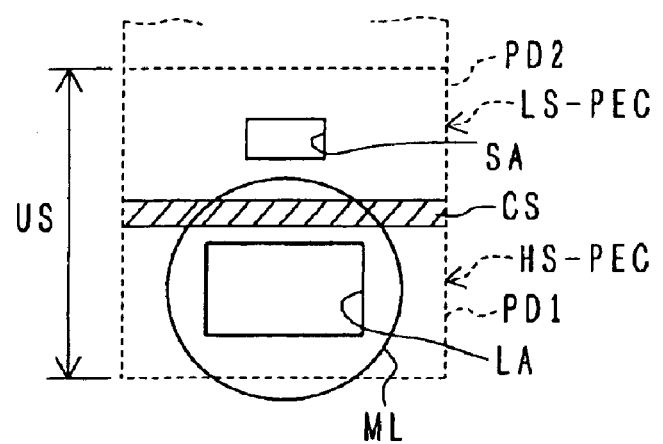
Figure 12A:
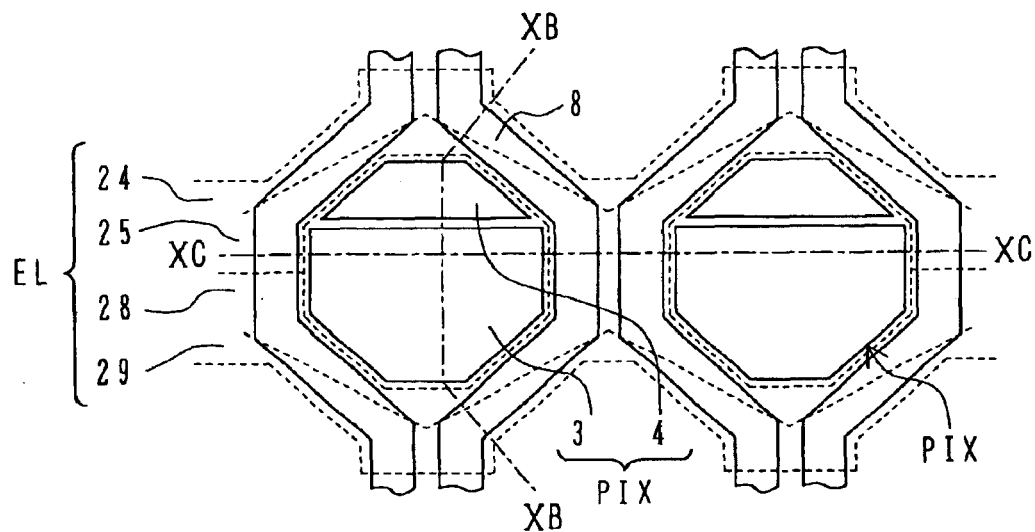
FIGS. 12A to 12C are a plan view and cross sectional views illustrating the outline of the contents of a previous application submitted by the present applicant.
Figure 12B:
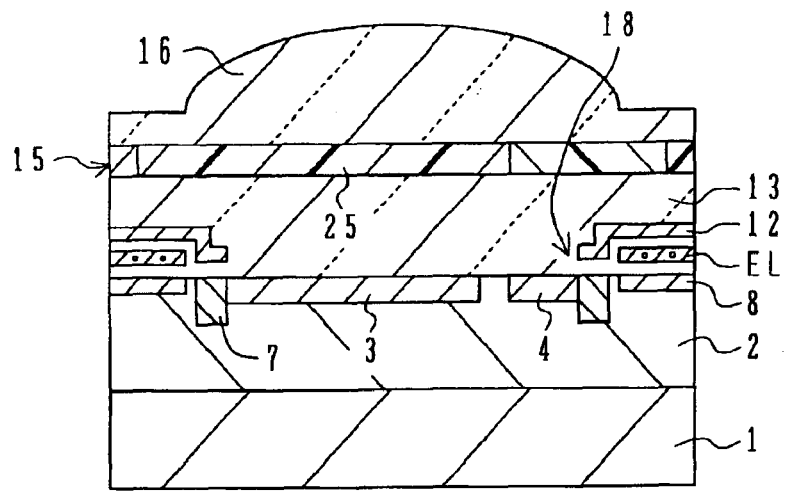
Figure 12C:
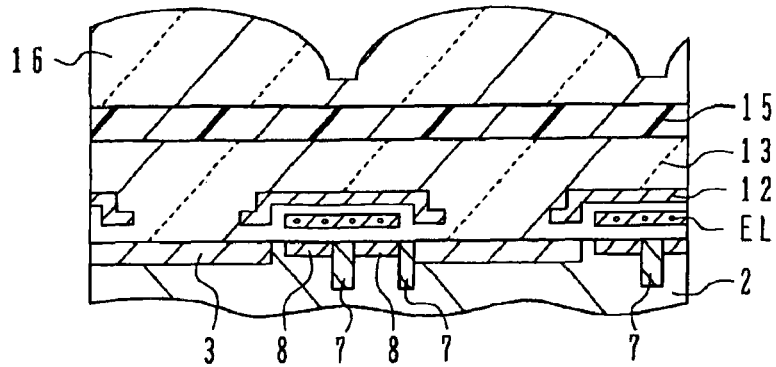

FIGS. 10A and 10B show modifications of the above-described embodiments. In FIG. 10A, a subsidiary photodiode area 4 has a substantially symmetrical area surrounding a main photodiode area 3, and a connection area coupling these photodiode areas 3 and 4. The substantially symmetrical area implies the concept including the layout which provides a function equivalent to the symmetrical layout in terms of a photoelectric conversion function. Electric charges accumulated in the subsidiary photodiode area 4 are transferred to an upper right channel as shown in FIG. 10A, whereas electric charges accumulated in the main photodiode area 3 are transferred to an lower right channel. The subsidiary photodiode area 4 is exposed to incidence light only in the areas near the upper and lower corners of the an opening 18.

FIG. 10B shows a MOS solid state image pickup device, not a CCD solid state image pickup device. MOS type charge detector circuits Q1 and Q2 are connected to a main photodiode area 3 and a subsidiary photodiode area 4 of each pixel. Outputs from the MOS type charge detector circuits Q1 and Q2 are supplied to output signal lines (image signal transfer units) TR via switches SW1 and SW2. Although the charge read mechanism is different, the function of receiving incidence light and photoelectrically converting it is similar to that of the embodiments described above.

The present invention has been described in connection with the preferred embodiments. The invention is not limited only to the above embodiments. It will be apparent to those skilled in the art that other various modifications, improvements, combinations, and the like can be made.

The solid state image pickup device of this invention is applicable to various apparatuses such as digital cameras and portable terminals, particularly to the apparatuses requiring a wide dynamic range.

We claim:

1. A solid state image pickup device comprising:
   a semiconductor substrate defining light receiving areas;
   a number of pixels formed in said light receiving areas of said semiconductor substrate, each pixel including a high sensitivity photoelectric conversion element and a low sensitivity photoelectric conversion element;
   a light shielding film formed above said light receiving areas and having an opening above each pixel, said opening exposing at least a partial area of said high sensitivity photoelectric conversion element and at least a partial area of said low sensitivity photoelectric conversion element;
   an on-chip micro lens formed above each opening of said light shielding film, said on-chip micro lens converging incidence light; and
   an inner lens formed between said light shielding film and said on-chip micro lens and above said opening, said inner lens being disposed so that said inner lens receives light converged by said on-chip micro lens, excluding a portion of said light, and further converges the received light to make said portion of said light propagate toward said opening without passing through said inner lens.

2. The solid state image pickup device according to claim 1, wherein said inner lens has an elliptic shape having a long axis and a short axis in plane.

3. The solid state image pickup device according to claim 1, wherein said inner lens is an isotropic spherical lens.

4. The solid state image pickup device according to claim 1, wherein an optical axis of said inner lens is shifted from an optical axis of said on-chip micro lens.

5. The solid state image pickup device according to claim 2, wherein an optical axis of said elliptic inner lens is shifted from an optical axis of said on-chip micro lens along a direction of said short axis.

6. The solid state image pickup device according to claim 1, wherein an optical axis of said inner lens is shifted from an optical axis of said on-chip micro lens in a direction departing from said low sensitivity photoelectric conversion element.

7. The solid state image pickup device according to claim 1, wherein said low sensitivity photoelectric conversion element has a plurality of areas surrounding said high sensitivity photoelectric conversion element.

8. The solid state image pickup device according to claim 1, wherein said low sensitivity photoelectric conversion element is disposed in a substantially symmetric area relative to said high sensitivity photoelectric conversion element as viewed in plan.

9. The solid state image pickup device according to claim 1, wherein an aperture ratio of said high sensitivity photoelectric conversion element exposed in said opening is higher than an aperture ratio of said low sensitivity photoelectric conversion element exposed in said opening.

10. The solid state image pickup device according to claim 1, wherein an area of said semiconductor substrate occupied by said high sensitivity photoelectric conversion element is larger than an area of said semiconductor substrate occupied by said low sensitivity photoelectric conversion element.

11. The solid state image pickup device according to claim 1, wherein said number of pixels are disposed in a matrix shape and the solid state image pickup device further comprises:
   an image signal transfer part formed along each column of said number of pixels; and
   a color filter disposed between said on-chip micro lens and said inner lens.

12. The solid state image pickup device according to claim 11, wherein said image signal transfer part includes a VCCD covered with said light shielding film, said VCCD including a channel formed in said semiconductor substrate, an insulating film covering a surface of said semiconductor substrate above said channel, and transfer electrodes formed on said insulating film.

13. The solid state image pickup device according to claim 12, wherein said number of pixels are disposed in a pixel shift layout in which positions of pixels are shifted by a half pitch at adjacent rows and at adjacent columns, and said channel of said VCCD is disposed in a zigzag way along a border of each pixel column.

14. The solid state image pickup device according to claim 11, wherein each pixel includes an image signal forming circuit made of MOS transistors and covered with said light shielding film, and said image signal transfer part includes wiring lines connected to said image signal forming circuit.

15. The solid state image pickup device according to claim 11, further comprising a first planarizing insulating layer having a first planarized surface and formed above said light shielding film, wherein said inner lenses are disposed on the first planarized surface.

16. The solid state image pickup device according to claim 11, further comprising a second planarizing insulating layer having a second planarized surface and covering said inner lenses, wherein said color filters are disposed on the second planarized surface.

17. The solid state image pickup device according to claim 11, further comprising a third planarizing insulating layer having a third planarized surface and covering said color filters, wherein said on-chip micro lenses are disposed on the third planarized surface.

18. The solid state image pickup device according to claim 1, wherein a border of said high sensitivity photoelectric conversion element is spaced apart from a border of said opening by a distance d along a first direction, and an optical axis of said inner lens is shifted from a center of said opening by a distance d/4 or more along the first direction.

19. The solid state image pickup device according to claim 18, wherein the optical axis of said inner lens is shifted from the center of said opening by a distance d/2 or more along the first direction.

20. The solid state image pickup device according to claim 1, wherein light passes through said on-chip micro lens and said inner lens is focussed on a surface of said semiconductor substrate.

21. The solid state image pickup device according to claim 2, wherein light passes through said on-chip micro lens and said elliptic inner lens is focussed on a surface of said semiconductor substrate with respect to a direction of the short axis of said elliptic inner lens.

22. The solid state image pickup device according to claim 2, wherein said high sensitivity photoelectric conversion element has a shape elongated along one direction, and a direction of the long axis of said elliptic inner lens is disposed in parallel to said one direction.

23. The solid state image pickup device according to claim 1, wherein said semiconductor substrate includes a base region of a first conductivity type and a well of a second conductivity type formed on said base region, wherein said high sensitivity photoelectric conversion element and said low sensitivity photoelectric conversion element include charge accumulation regions of the first conductivity type formed in said well.

24. The solid state image pickup device according to claim 23, further comprising an isolation region of the second conductivity type formed between said high sensitivity photoelectric conversion element and said low sensitivity photoelectric conversion element.

* * * * *